United States Patent
Lu et al.

(10) Patent No.: US 10,847,425 B2
(45) Date of Patent: Nov. 24, 2020

(54) SEMICONDUCTOR DEVICES AND FABRICATION METHODS THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Yi Lu, Shanghai (CN); Changyong Xiao, Shanghai (CN); Yihui Lin, Shanghai (CN); Qin Zhang, Shanghai (CN); Hua Wang, Shanghai (CN); Xiang Hu, Shanghai (CN); Xiaona Zhu, Shanghai (CN); Ying Jiang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/511,747

(22) Filed: Jul. 15, 2019

(65) Prior Publication Data
US 2020/0020590 A1    Jan. 16, 2020

(30) Foreign Application Priority Data
Jul. 13, 2018    (CN) .......................... 2018 1 0769212

(51) Int. Cl.
  *H01L 21/00*    (2006.01)
  *H01L 29/00*    (2006.01)
  (Continued)

(52) U.S. Cl.
  CPC ............... *H01L 21/823475* (2013.01); *H01L 21/26506* (2013.01); *H01L 21/31053* (2013.01);
  (Continued)

(58) Field of Classification Search
  CPC ....... H01L 21/823475; H01L 21/28518; H01L 21/31053; H01L 21/823437;
  (Continued)

(56) References Cited

U.S. PATENT DOCUMENTS 9,548,366 B1 * 1/2017 Ho ...................... H01L 29/6656
9,831,183 B2 * 11/2017 Lin ................... H01L 21/76802
10,157,790 B1 * 12/2018 You ..................... H01L 21/0337

* cited by examiner

Primary Examiner — Nikolay K Yushin
(74) Attorney, Agent, or Firm — Anova Law Group, PLLC

(57) ABSTRACT

A method for fabricating a semiconductor device includes forming a plurality of gate structures, a source/drain doped layer, a barrier layer, and a dielectric layer on a base substrate. The barrier layer covers the entire top surfaces of the plurality of gate structures. The dielectric layer covers the source/drain doped layer, the barrier layer, and the gate structures. The method further includes forming a plurality of first vias in the dielectric layer on both sides of each gate structure above the source/drain doped layer; forming a plurality of second vias on the gate structures to expose the barrier layer; performing a pre-amorphizing implantation process on the surface of the source/drain doped layer at the bottom of the first vias; removing the barrier layer at the bottom of the second vias; and forming a metal silicide layer on the surface of the source/drain doped layer through a metal silicidation process.

20 Claims, 9 Drawing Sheets

(51) Int. Cl.
  *H01L 21/8234* (2006.01)
  *H01L 21/265* (2006.01)
  *H01L 29/66* (2006.01)
  *H01L 21/762* (2006.01)
  *H01L 21/3105* (2006.01)
  *H01L 29/45* (2006.01)

(52) U.S. Cl.
  CPC .............. *H01L 21/76224* (2013.01); *H01L 21/823412* (2013.01); *H01L 21/823431* (2013.01); *H01L 21/823437* (2013.01); *H01L 21/823481* (2013.01); *H01L 29/45* (2013.01); *H01L 29/665* (2013.01); *H01L 29/66545* (2013.01)

(58) Field of Classification Search
  CPC ......... H01L 21/76224; H01L 21/26506; H01L 21/823431; H01L 21/823481; H01L 21/823412; H01L 21/823418; H01L 29/401; H01L 29/665; H01L 29/66795; H01L 29/45; H01L 29/66545; H01L 29/4991; H01L 2029/7858
  See application file for complete search history.

SEMICONDUCTOR DEVICES AND FABRICATION METHODS THEREOF

CROSS-REFERENCES TO RELATED APPLICATIONS

This application claims the priority of Chinese Patent Application No. CN201810769212.4, filed on Jul. 13, 2018, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

Metal-oxide-semiconductor (MOS) transistor is one of the most important components in modern integrated circuits (ICs). The basic structure of an MOS transistor includes: a semiconductor substrate; a gate structure, formed on the surface of the semiconductor substrate; and two source-drain doped regions formed in the semiconductor substrate on both sides of the gate structure. The gate structure includes a gate dielectric layer formed on the surface of the semiconductor substrate; and a gate electrode layer disposed on the surface of the gate dielectric layer.

The operating principle of the MOS transistor is that by applying a voltage to the gate structure, the current in the channel under the gate structure can be adjusted, thereby generating a switching signal.

However, the performance of semiconductor devices fabricated based on the existing technology may still need to be improved, the disclosed semiconductor devices and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes providing a base substrate; and forming a plurality of gate structures, a source/drain doped layer, a barrier layer, and a dielectric layer. The plurality of gate structures is formed on the base substrate, the source/drain doped layer is formed in the base substrate on both sides of each gate structure, the barrier layer covers the entire top surfaces of the plurality of gate structures, and the dielectric layer covers the base substrate, the source/drain doped layer, the barrier layer, and the plurality of gate structures. The method further includes forming a plurality of first vias in the dielectric layer on both sides of each of the plurality of gate structures and above the source/drain doped layer; forming a plurality of second vias on the plurality of gate structures through the dielectric layer to expose the barrier layer; performing a pre-amorphizing implantation process on the surface of the source/drain doped layer at the bottom of the plurality of first vias; removing the barrier layer at the bottom of the plurality of second vias; and forming a metal silicide layer on the surface of the source/drain doped layer through a metal silicidation process.

Another aspect of the present disclosure provides a semiconductor device. The semiconductor device is formed by a method according to the present disclosure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-4 illustrate schematic views of structures at various stages in a process for fabricating a semiconductor device.

Figure 1:
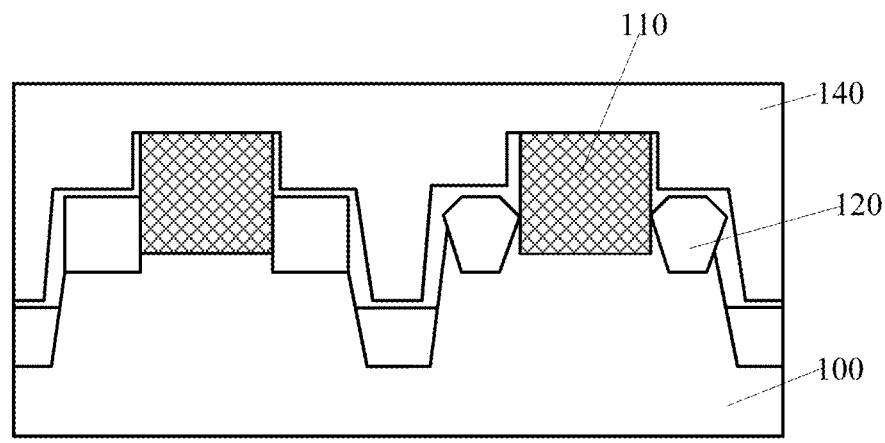
FIGS. 1-4 illustrate schematic views of structures at various stages in a process for fabricating a semiconductor device.

Referring to FIG. 1, a base substrate 100 is provided, and a plurality of gate structures 110 is formed on the base substrate 100. For illustration purposes, the semiconductor structure shown in FIG. 1 is described to include two gate structures 110, although the number of gate structures included in the semiconductor structure may be different from two. In addition, a source/drain doped layer 120 and a dielectric layer 140 may be formed on the semiconductor substrate 100. The source/drain doped layer 120 may be formed in the semiconductor substrate 100 on both sides of each gate structure 110, and the dielectric layer 140 may cover the plurality of gate structures 110 and the semiconductor substrate 100.

Figure 2:
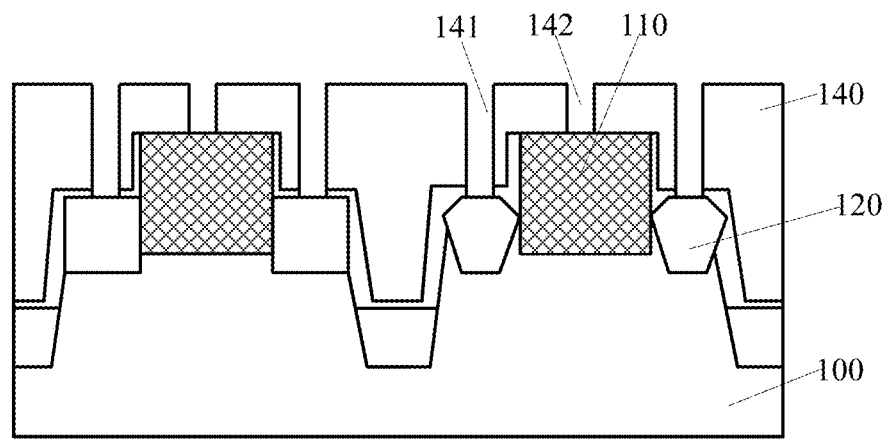

Referring to FIG. 2, two first vias 141 are formed in the dielectric layer 140 on both sides of each gate structure 110. That is, a plurality of first vias 141 is formed in the dielectric layer 140 with each first via 141 exposing a portion of the source/drain doped layer 120. After forming the first vias 141, a second via 142 is formed in the dielectric layer 140 on each gate structure 110. That is, a plurality of second vias 142 is formed in the dielectric layer 140 with each second via 142 exposing the top surface of a corresponding gate structure 110.

As the feature size of the semiconductor device continues to decrease, simultaneously patterning the dielectric layer 140 on the source/drain doped layer 120 and the dielectric layer 140 on the gate structures 110 becomes difficult due to the limitations of the lithographic technique. Therefore, the plurality of first vias 141 and the plurality of second vias 142 may need to be formed separately.

Figure 3:
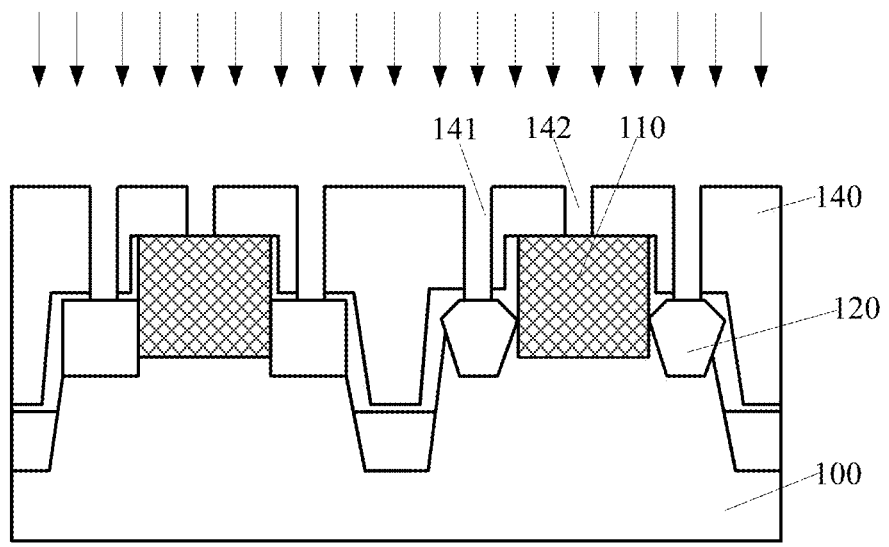

Referring to FIG. 3, after forming the plurality of second vias 142, a pre-amorphizing implantation process is performed on the surface of the source/drain doped layer 120 exposed at the bottom of the plurality of first vias 141.

Figure 4:
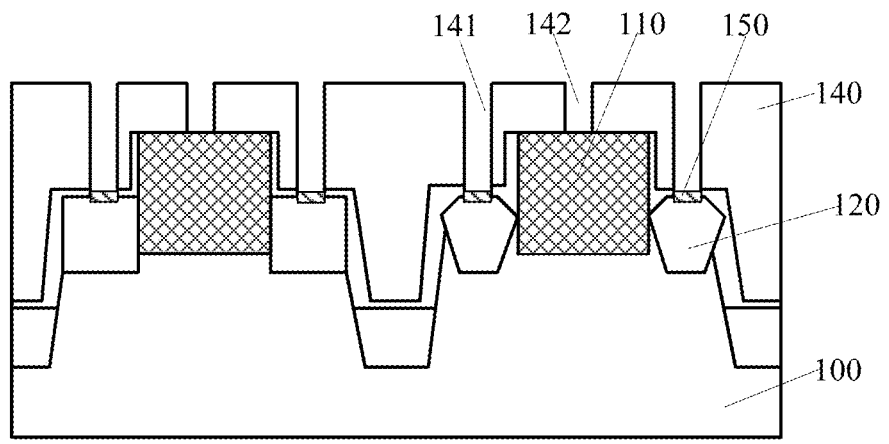

Referring to FIG. 4, after performing the pre-amorphizing implantation process, a metal silicide layer 150 is formed on the surface of the source/drain doped layer 120 through a metal silicidation process. The metal silicidation process includes the following steps. First, a metal layer is formed on the surface of the source/drain doped layer 120. After forming the metal layer, an annealing process is then performed. During the annealing process, the metal layer reacts with the surface material of the source/drain doped layer, and thus the metal silicide layer 150 is formed.

In one embodiment, the metal silicidation process is performed after forming the plurality of second vias 142. The reason for choosing the metal silicidation process to be performed after the formation of the plurality of second vias 142 is the following. The step for forming the plurality of second vias 142 includes multiple etching processes, and when the metal silicidation process is performed before the plurality of second vias 142 is formed, the multiple etching processes in the step of forming the plurality of second vias 142 may cause damages to the metal silicide layer, and thus degrade the electrical performance of the metal silicide layer.

Moreover, performing the pre-amorphizing implantation process prior to performing the metal silicidation process may be able to amorphize the surface material of the source/drain doped layer 120, and thus may be conducive to reducing the annealing temperature in the metal silicidation process.

Further, the pre-amorphizing implantation process is performed after forming the plurality of second vias 142. The reason for choosing the pre-amorphizing implantation process to be performed after the formation of the plurality of second vias 142 is the following. When the pre-amorphizing implantation process is performed after forming the plurality of second vias, the number of steps between the pre-amorphizing implantation process and the metal silicidation process is limited, and thus the influence on the amorphous state of the surface material of the source/drain doped layer can be reduced.

However, since the plurality of second vias 142 expose the top surfaces of the plurality of gate structures 110 during the pre-amorphizing implantation, the amorphizing ions may be implanted into the plurality of gate structures 110, causing unpredictable fluctuations in the electrical performance of the semiconductor device, e.g. fluctuations in the threshold voltage. In addition, during the pre-amorphizing implantation process, metal atoms on the top surfaces of the plurality of gate structures 110 may also be sputtered, causing contamination of the chamber used for pre-amorphizing implantation.

The present disclosure provides a method for forming a semiconductor device. According to the disclosed method, a barrier layer may be formed on the entire top surface of each gate structure, and the barrier layer may then be covered by a dielectric layer. Further, a plurality of first vias may be formed in the dielectric layer on both sides of each gate structure to expose the source/drain doped layer, and a plurality of second vias may then be formed through the dielectric layer to expose the barrier layer formed on each gate structure. Moreover, a pre-amorphizing implantation process may be performed on the surface of the source/drain doped layer at the bottom of each first via, and then, the barrier layer formed at the bottom of each second via may be removed. Further, a metal silicide layer may be formed by performing a metal silicidation process on the surface of the source/drain doped layer. The disclosed method may be able to improve the performance of the semiconductor device.

In order to further illustrate the above described objects, features, and advantages of the present disclosure, various specific embodiments of the present disclosure will be described in detail below with reference to the accompanying drawings.

Figure 14:
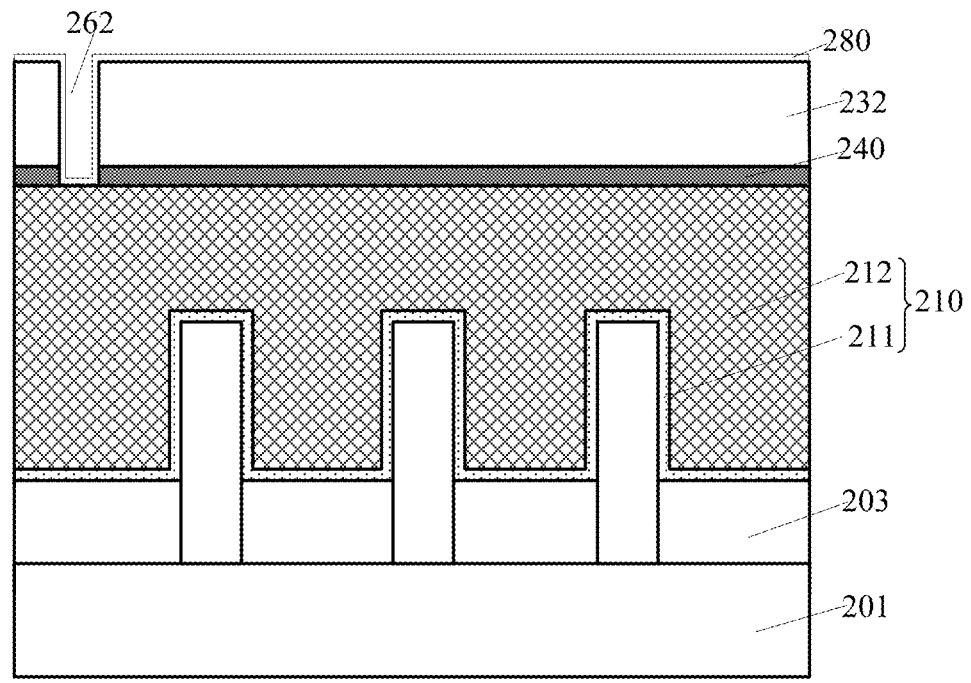
Figure 15:
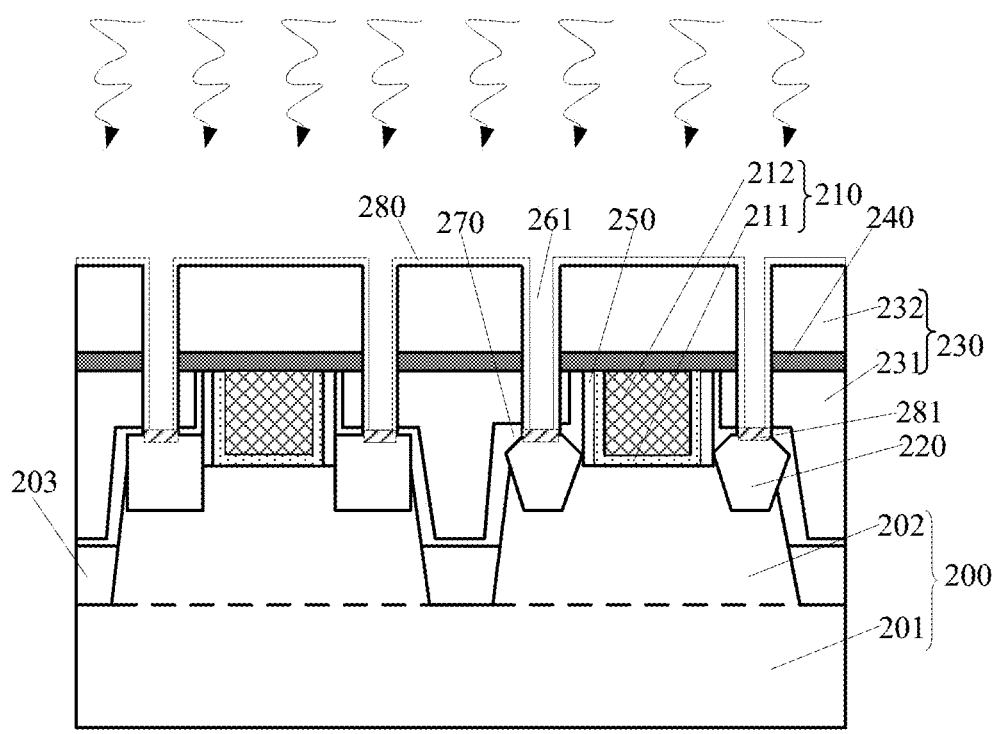
Figure 16:
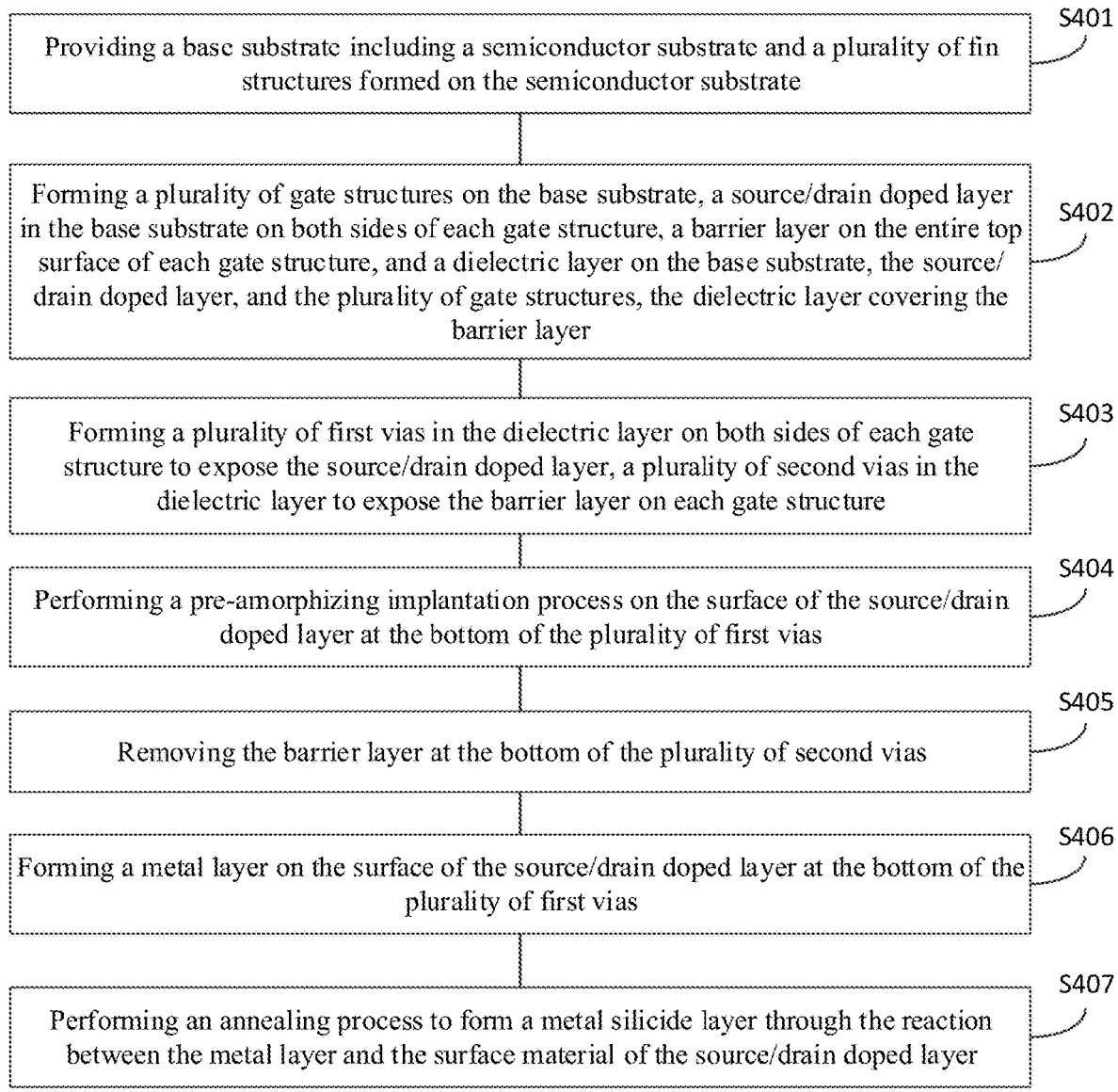
FIG. 16 illustrates a flowchart of an exemplary method for fabricating a semiconductor device consistent with various embodiments of the present disclosure.

FIG. 16 illustrates a flowchart of an exemplary method for fabricating a semiconductor device consistent with various embodiments of the present disclosure. FIGS. 5-15 illustrate schematic views of semiconductor structures at certain stages of the exemplary method.

Figure 5:
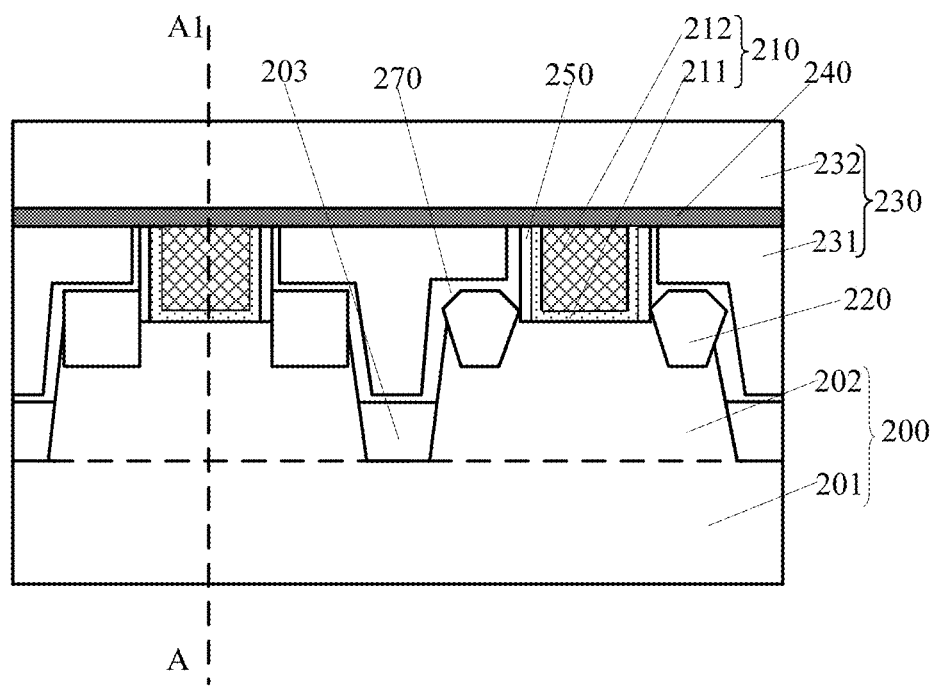
FIGS. 5-15 illustrate schematic views of semiconductor structures at certain stages of an exemplary method for fabricating a semiconductor device consistent with some embodiments of the present disclosure.
Figure 6:
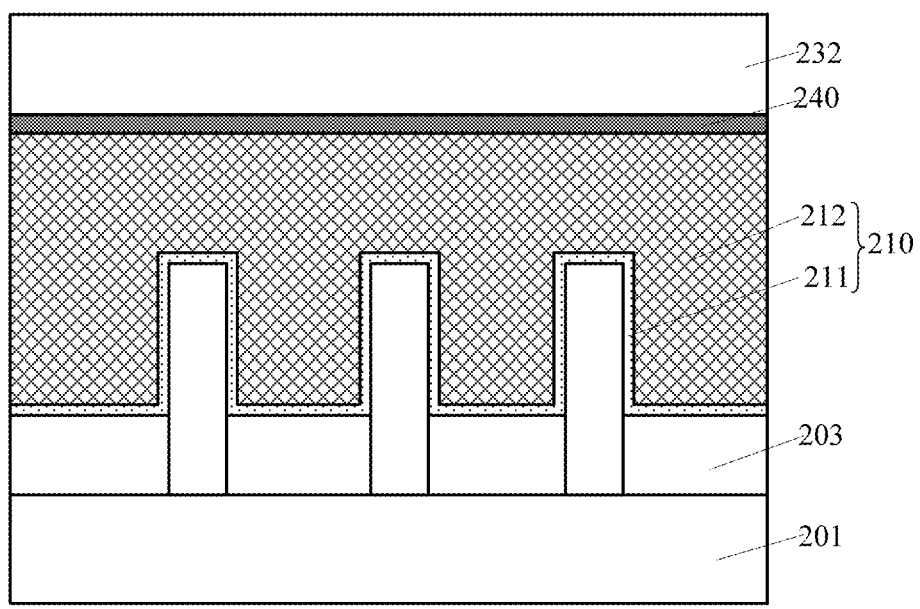

Referring to FIG. 16, a base substrate, including a semiconductor substrate and a plurality of fin structures formed on the semiconductor substrate, may be provided (S401). FIGS. 5-6 illustrate schematic cross-sectional views of a semiconductor structure consistent with various embodiments of the present disclosure. Specifically, FIG. 6 shows a cross-sectional view of the structure shown in FIG. 5 along an A-A1 line.

Referring to FIGS. 5-6, a base substrate 200 may be provided. In one embodiment, the semiconductor device to be formed may be a device including a plurality of fin field-effect transistors (Fin-FETs), and accordingly, the base substrate 200 may include a semiconductor substrate 201 and a plurality of fin structures 202 formed on the semiconductor substrate 201.

In one embodiment, the semiconductor substrate 201 may be made of single-crystalline silicon. In some other embodiments, the semiconductor substrate may be made of amorphous silicon or poly-crystalline silicon. Alternatively, the semiconductor substrate may be made of germanium, silicon germanium, gallium arsenide, or any other appropriate semiconductor materials or structures.

In one embodiment, an isolation structure 203 may be formed on the semiconductor substrate 201. The isolation structure 203 may cover a portion of the sidewall surfaces of the plurality of fin structures 202, and the top surface of the isolation structure 203 may be lower than the top surfaces of the plurality of fin structures 202. The isolation structure 203 may be made of silicon oxide.

In other embodiments, the semiconductor device to be formed may be a device including a plurality of planar MOS transistors, and accordingly, the base substrate may be a planar semiconductor substrate.

Further, returned to FIG. 16, a plurality of gate structures may be formed on the base substrate, a source/drain doped layer may be formed in the base substrate on both sides of each gate structure, a barrier layer may be formed on the entire top surface of each gate structure, and a dielectric layer may be formed on the base substrate, the source/drain doped layer, and the plurality of gate structures with the dielectric layer covering the barrier layer (S402). The semiconductor structure shown in FIGS. 5-6 is consistent with various embodiments of the present disclosure.

Referring to FIGS. 5-6, a plurality of gate structures 210 may be formed on the base substrate 200, a source/drain doped layer 220 may be formed in the base substrate 200 on to both sides of each gate structure 210, and a dielectric layer 230 may be formed to cover the base substrate 200, the source/drain doped layer 220, and the plurality of gate structures 210. During the formation of the dielectric layer 230, a barrier layer 240 may be formed to cover the entire top surface of each gate structure. The barrier layer 240 may be covered by the dielectric layer 230.

In one embodiment, the dielectric layer 230 may be made of a material including silicon oxide. The dielectric layer 230 may include a first interlayer dielectric layer 231 and a second interlayer dielectric layer 232 separated by the barrier layer 240.

In one embodiment, each of the plurality of gate structures 210 may include a gate dielectric layer 211 and a gate electrode layer 212 formed on the gate dielectric layer 211. The gate dielectric layer 211 may be made of a high-k dielectric material (a material with a relative dielectric constant k greater than 3.9). The gate electrode layer 212 may be made of a metal. In one embodiment, the plurality of gate structures 210 may be formed across the plurality of fin structures 210 and may cover a portion of the top and sidewall surfaces of each fin structure 210.

In one embodiment, the process of forming the plurality of gate structures 210, the source/drain doped layer 220, and the dielectric layer 230 may include the following exemplary steps. First, a plurality of dummy gate structures (not shown) may be formed on the base substrate 200. The source/drain doped layer 220 may then be formed in the base substrate 200 on both sides of each dummy gate structure. The first interlayer dielectric layer 231 may then be formed on the base substrate 200, the plurality dummy gate structures, and the source/drain doped layer 220. The first interlayer dielectric layer 231 may cover the sidewall surfaces of each dummy gate structure and may expose the top surface of each dummy gate structure. After forming the first interlayer dielectric layer 231, the plurality of dummy gate structures may be removed to form a plurality of gate openings in the first interlayer dielectric layer 231. A plurality of gate structures 210 may then be formed in the plurality of gate openings. Further, the second interlayer dielectric layer 232 may be formed on the plurality of gate structures 210 and the first interlayer dielectric layer 231.

In one embodiment, prior to forming the source/drain doped layer 220, the method may further include forming a sidewall spacer 250 on the sidewall of each dummy gate structure. Accordingly, the source/drain doped layer 220 may be formed in the base substrate 200 on the side of each sidewall spacer 250 opposite to the corresponding dummy gate structure. The first interlayer dielectric layer 231 may be formed to cover the sidewall of each sidewall spacer 250. After forming the plurality of gate structures 210, each sidewall spacer 250 may be located on the sidewall of a gate structure 210. The source/drain doped layer 220 may be located in the fin structure 202 on both sides of each gate structure 210. Moreover, the second interlayer dielectric layer 232 may also be formed on the sidewall 250.

In one embodiment, the barrier layer 240 may be formed prior to forming the second interlayer dielectric layer 232. Accordingly, the second interlayer dielectric layer 232 may also be formed on the barrier layer 240.

In one embodiment, the top surfaces of the plurality of gate structures 210 may be leveled with the top surface of the first interlayer dielectric layer 231. The barrier layer 240 may be located on the top surfaces of the first interlayer dielectric layer 231 and the plurality of gate structures 210. The barrier layer 240 may also cover the top surface of each sidewall spacer 250. In one embodiment, the barrier layer 240 may be formed by a deposition process, such as atomic layer deposition (ALD), or plasma chemical vapor deposition (CVD), etc.

In one embodiment, the barrier layer 240 and the dielectric layer 230 may be made of different materials. For example, when the dielectric layer 230 is made of silicon oxide, the barrier layer 240 may be made of a material including $SiN_x$, SiOCN, SiBCN, or SiCN.

The thickness of the barrier layer may not be too large or too small. When the thickness of the barrier layer 240 is smaller than 3 nm, the barrier layer 240 may not be able to demonstrate sufficient blocking ability during the subsequent pre-amorphizing implantation process. When the thickness of the barrier layer 240 is larger than 5 nm, the overly large thickness may result in an increase in the time and complexity of the subsequent process for removing the barrier layer 240 at the bottom of a plurality of second vias. Therefore, in one embodiment, the thickness of the barrier layer may be in a range of approximately 3 nm to 5 nm, e.g. 4 nm.

In other embodiments, the top surfaces of the plurality of gate structures may be lower than the top surface of the first interlayer dielectric layer, and the barrier layer may only be formed on the top surfaces of the plurality of gate structures. For example, after forming the plurality of gate structures in the plurality of gate openings, the barrier layer may be formed in the plurality of gate openings to cover the plurality of gate structures. Accordingly, the process of forming the barrier layer may include the following exemplary steps. First, a barrier material layer may be formed in the plurality of gate openings and also on the first interlayer dielectric layer. The barrier layer may then be formed by planarizing the barrier material layer until the top surface of the first interlayer dielectric layer is exposed.

In one embodiment, the method may further include forming a second protective layer 270 during the process of forming the plurality of gate structures 210, the source/drain doped layer 220, and the dielectric layer 230. The second protective layer 270 may be located on the top surface of the source/drain doped layer 220. Accordingly, the dielectric layer 230 may also cover the second protective layer 270.

In one embodiment, the second protective layer 270 may be made of a material including $SiN_x$, SiOCN, SiBCN, or SiCN. The thickness of the second protective layer 270 may be in a range of approximately 3 nm to 5 nm, e.g. 4 nm.

In one embodiment, the thickness of the second protective layer 270 may be consistent with the thickness of the barrier layer 240. As such, when removing the second protective layer 270 at the bottom of the plurality of first vias and the barrier layer 240 at the bottom of the plurality of second vias, the top surfaces of the plurality of gate structures 210 may be simultaneously exposed as the top surface of the source/drain doped layer 220 is exposed.

Figure 7:
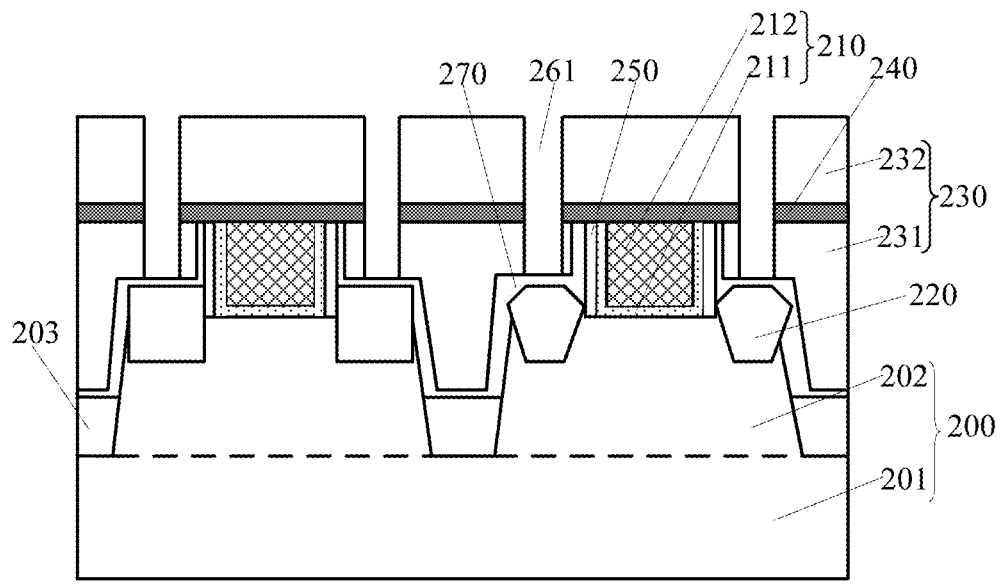
Figure 8:
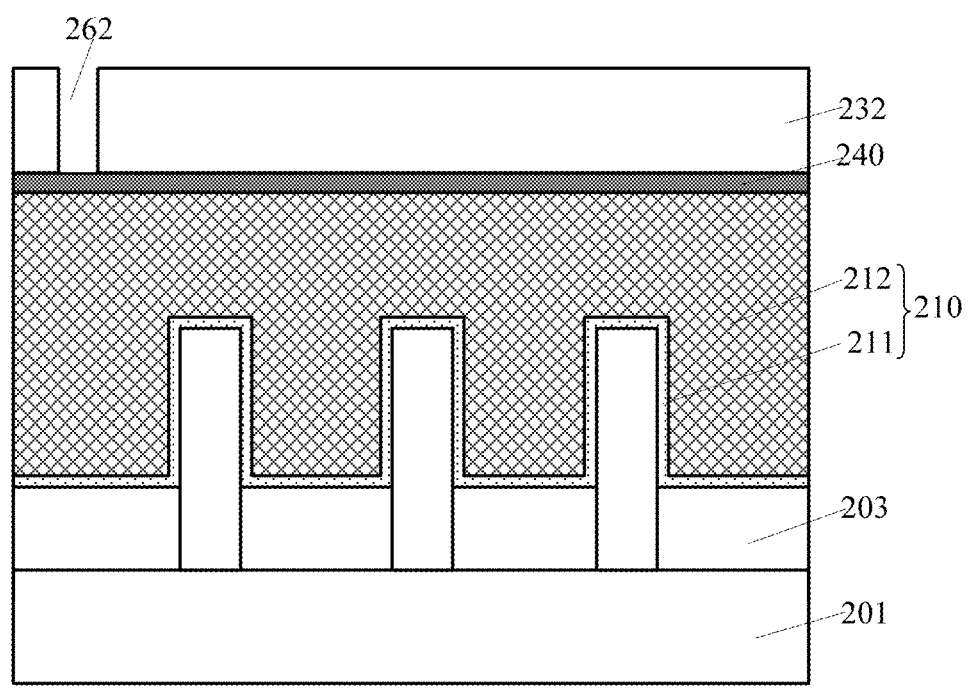

Further, returning to FIG. 16, after forming the barrier layer, a plurality of first vias may be formed in the dielectric layer on both sides of each gate structure to expose the source/drain doped layer, and then a plurality of second vias may be formed in the dielectric layer to expose the barrier layer on each gate structure (S403). FIGS. 7-8 illustrate schematic cross-sectional views of a semiconductor structure consistent with various embodiments of the present disclosure. Specifically, FIG. 7 illustrates a structural view processed from the structural view shown in FIG. 5, and FIG. 8 illustrates a structural view processed from the structural view shown in FIG. 6.

Referring to FIGS. 7-8, after forming the barrier layer 240, a plurality of first vias 261 may be formed in the dielectric layer 230 on both sides of each gate structure 210. The plurality of first vias 261 may be located on the top of the source/drain doped layer 220. That is, the plurality of first vias 261 may expose the top surface of the source/drain doped layer 220. After forming the plurality of first vias 261, a plurality of second vias 262 may be formed on the plurality of gate structures 210 through the dielectric layer 230. The plurality of second vias 262 may expose the barrier layer 240 on the top surfaces of the plurality of gate structures 210.

In one embodiment, the plurality of first vias 261 may also be formed through the barrier layer 240.

In one embodiment, the plurality of first vias 261 and the plurality of second vias 262 may be formed in different steps. The reason for forming the plurality of first vias 261 and the plurality of second vias 262 in different steps may be the following. With the continuous decrease of the feature size of the semiconductor device, the distance between the center position of the portion of the source/drain doped layer 220 on the side of a gate structure 210 and the center position of the gate structure 210 may be continuously reduced. Due to the limitation of the photolithography process, simultaneously patterning the dielectric layer 230 on the source/drain doped layer 220 and the dielectric layer 230 on the plurality of gate structures 210 may be difficult. Therefore, it may be necessary to form the plurality of first vias 261 and the plurality of second vias 262 in different steps. In one embodiment, the plurality of first vias 261 may be formed prior to forming the plurality of second vias 262. In other embodiments, the plurality of second vias 262 may be formed prior to forming the plurality of first vias 261.

In one embodiment, the plurality of first vias 261 may expose the second protective layer 270 formed on the surface of the source/drain doped layer 220. In other embodiments, the plurality of first vias may expose the top surface of the source/drain doped layer 220.

In one embodiment, the process of forming the plurality of second vias 262 may include the following exemplary steps. After forming the plurality of first vias 261, a planarization layer (not shown) may be formed to fill the plurality of first vias 261. The planarization layer may also be formed on the dielectric layer 230. A photoresist layer may be formed on the planarization layer, and the photoresist layer may be used to define the positions of the plurality of second vias 262. The portion of the dielectric layer 230 and the planarization layer formed on the plurality of gate structures 210 may be etched through an anisotropic dry etching process using the photoresist layer as an etch mask until the barrier layer 240 is exposed. The plurality of second vias 262 may be formed on the plurality of gate structures 210 through the dielectric layer 230 and the barrier layer 240. Further, the photoresist layer may be removed, and the planarization layer may then be removed after removing the photoresist layer.

The planarization layer may be made of a material including a photoresist material, a bottom anti-reflective layer material, or an organic polymer. The planarization layer may be formed through a spin-coating process. The process of removing the planarization layer may be a dry etching process, and the gas used in the dry etching process may be an oxygen-containing gas.

In one embodiment, during the process of removing the planarization layer, the second protective layer 270 may be able to protect the surface of the source/drain doped layer 220, preventing the surface of the source/drain doped layer 220 from being oxidized.

Figure 9:
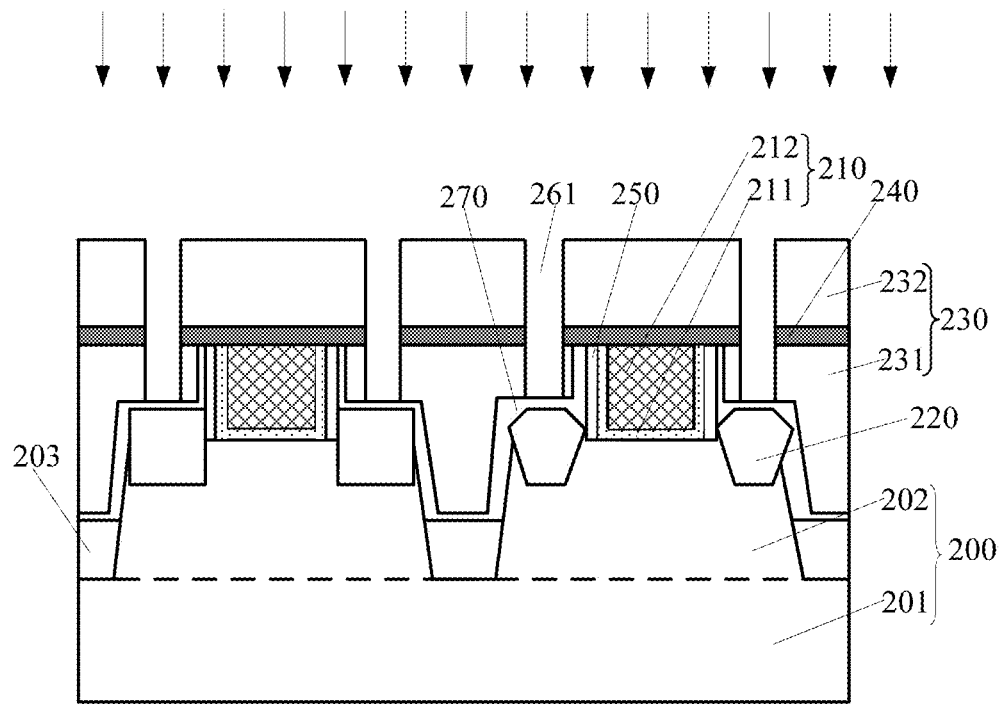
Figure 10:
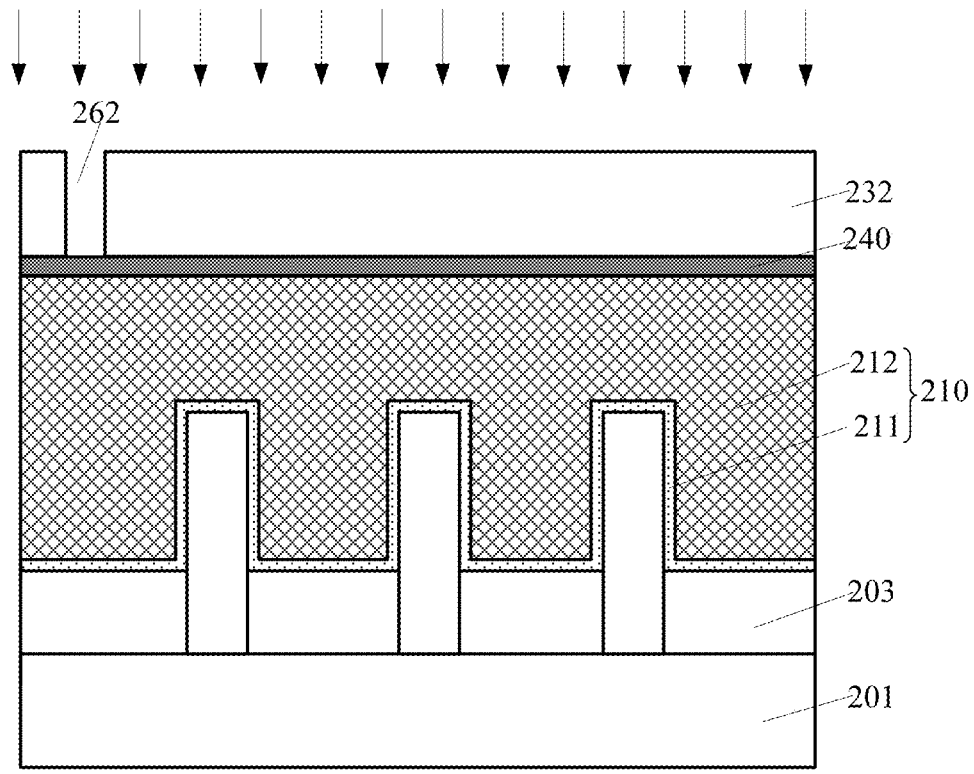

Further, returning to FIG. 16, after forming the plurality of second vias and the barrier layer, a pre-amorphizing implantation process may be performed on the surface of the source/drain doped layer at the bottom of the plurality of first vias (S404). FIGS. 9-10 illustrate schematic cross-sectional views of a semiconductor structure consistent with various embodiments of the present disclosure. Specifically, FIG. 9 illustrates a structural view processed from the structural view shown in FIG. 7, and FIG. 10 illustrates a structural view processed from the structural view shown in FIG. 8.

Referring to FIGS. 9-10, after forming the plurality of second vias 262 and the barrier layer 240, a pre-amorphizing implantation process may be performed on the surface of the source/drain doped layer 220 exposed at the bottom of the plurality of first vias 261. In one embodiment, the pre-amorphizing implantation process may be performed after the removal of the planarization layer.

In one embodiment, the pre-amorphizing implantation process may have the following effects. The surface material of the source/drain doped layer 220 may be amorphized, such that the surface roughness of a metal silicide layer that is subsequently formed on the surface of the source/drain doped layer 220 may be low, and the contact resistance between each first plug that is subsequently formed in a first via 261 and the source/drain doped layer 220 may be small. In addition, amorphizing the surface material of the source/drain doped layer 220 may be conducive to reducing the annealing temperature and the annealing time for a subsequently performed metal silicidation process.

The ions implanted by the pre-amorphizing implantation process may include germanium (Ge) ions. In one embodiment, the pre-amorphizing implantation process may use Ge ions as the doping ions. Ge ions are neither N-type ions, nor P-type ions, and thus Ge ions may have negligible effect on the electrical performance of the source/drain doped layer 220.

The parameters adopted in the pre-amorphizing implantation process may include an implantation energy in a range of approximately 2 keV to 20 keV, an implantation dose in a range of approximately 1.0E12 atom/cm$^2$ to 1.0E16 atom/cm$^2$, and an implantation angle in a range of 0° to approximately 30°. The implantation angle may be the angle between the implantation direction and the normal direction of the semiconductor substrate.

In one embodiment, the pre-amorphizing implantation process may be able to implant the doping ions into the surface of the source/drain doped layer 220 through the second protective layer 270 to amorphize the surface material of the source/drain doped layer 220. The doping ions may penetrate through the second protective layer 270 and may be scattered into the source/drain doped layer 220, such that the doping ions may not be implanted deeply into the source/drain doped layer 220 by penetrating through the lattice gap of the source/drain doped layer 220, which may facilitate the amorphization of the surface material of the source/drain doped layer 220.

In one embodiment, after forming the plurality of second vias 262, the surface of the source/drain doped layer 220 at the bottom of the plurality of first vias 261 may be subjected to a pre-amorphizing implantation process, such that the number of steps between the pre-amorphizing implantation process and the subsequent metal silicidation process may be limited. Therefore, the influence on the amorphous state of the surface material of the source/drain doped layer 220 may be reduced. When a large number of steps is needed after the completion of the pre-amorphizing implantation process and prior to performing the metal silicidation process, the process temperature may be able to reduce the degree of the amorphous state of the surface material of the source/drain doped layer during these steps, which may be disadvantageous for performing the subsequent metal silicidation process.

In one embodiment, due to the formation of a barrier layer 240 on the top surfaces of the plurality of gate structures 210, when performing the pre-amorphizing implantation process, the barrier layer 240 may be able to prevent implantation of the ions used in the pre-amorphizing implantation process into the plurality of gate structures 210, thereby avoiding unpredictable fluctuations in the electrical performance of the semiconductor device, e.g. fluctuations in the threshold voltage. In addition, during the pre-amorphizing implantation process, the metal atoms may not be sputtered on the top surfaces of the plurality of gate structures 210, and thus contamination of the chamber used for pre-amorphizing implantation may be prevented.

Figure 11:
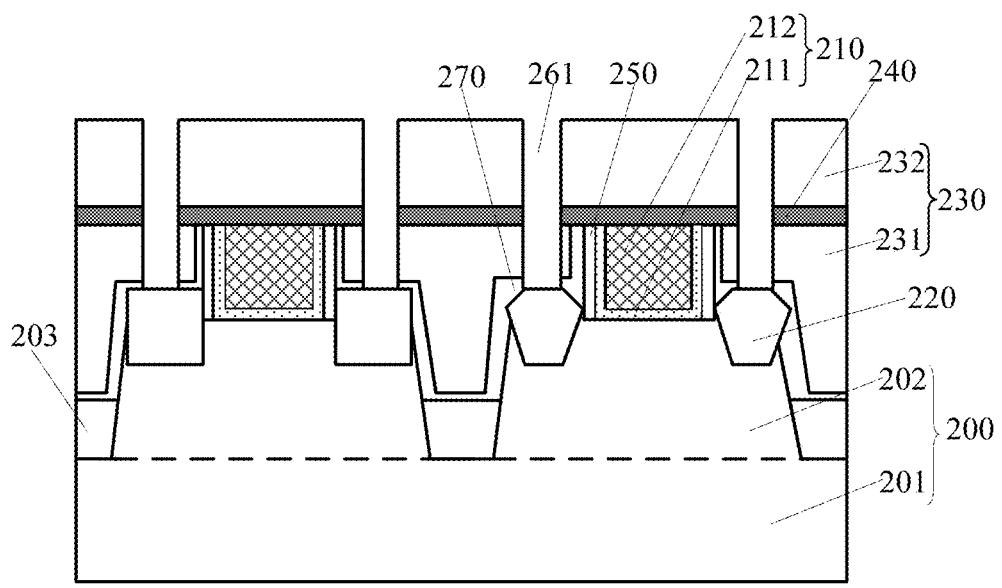
Figure 12:
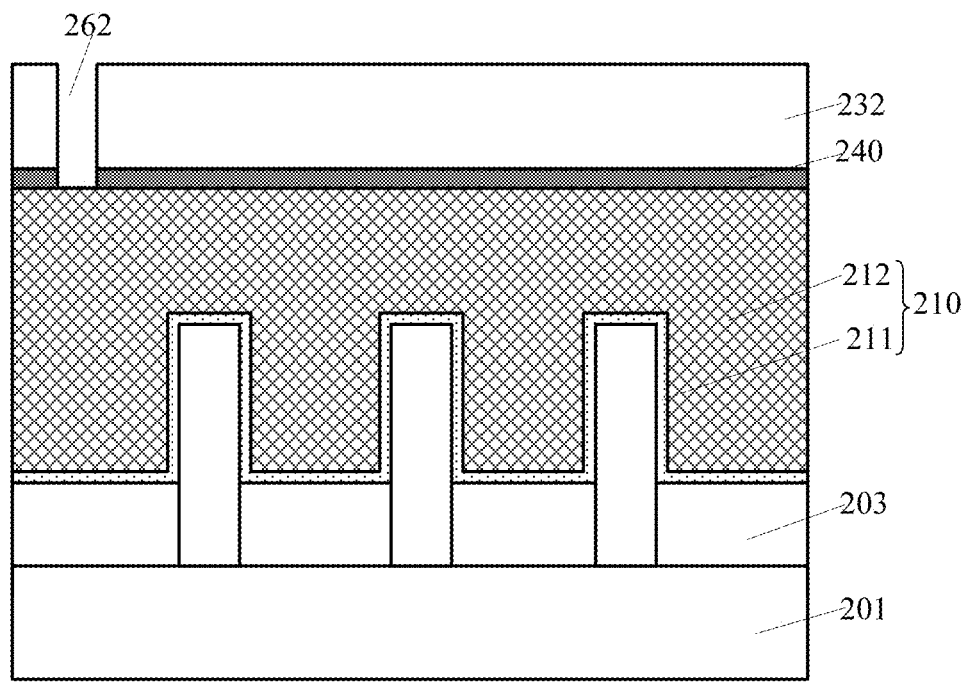

Further, returning to FIG. 16, after performing the pre-amorphizing implantation process, the barrier layer at the bottom of the plurality of second vias may be removed (S405). FIGS. 11-12 illustrate schematic cross-sectional views of a semiconductor structure consistent with various embodiments of the present disclosure. Specifically, FIG. 11 illustrates a structural view processed from the structural view shown in FIG. 9, and FIG. 12 illustrates a structural view processed from the structural view shown in FIG. 10.

Referring to FIGS. 11-12, after performing the pre-amorphizing implantation process, the portion of the barrier layer 240 formed at the bottom of the plurality of second vias 262 may be removed. In one embodiment, the process of removing the barrier layer 240 formed at the bottom of the plurality of second vias 262 may be a dry etching process or a wet etching process.

In one embodiment, during the process of removing the barrier layer 240 at the bottom of the plurality of second vias 262, the second protective layer 270 at the bottom of the plurality of first vias 261 may also be removed. That is, the barrier layer 240 at the bottom of the plurality of second vias 262 and the second protective layer 270 at the bottom of the plurality of first vias 261 may be removed in a single etching process. Therefore, the fabrication process may be simplified.

In one embodiment, the barrier layer 240 and the second protective layer 270 may be made of a same material, which may be conducive to simultaneously removing the the barrier layer 240 at the bottom of the plurality of second vias 262 and the second protective layer 270 at the bottom of the plurality of first vias 261. For example, the barrier layer 240 and the protective layer 270 may be both made of silicon nitride.

In one embodiment, the process of removing the barrier layer 240 at the bottom of the plurality of second vias 262 and the second protective layer 270 at the bottom of the plurality of first vias 261 may be a wet etching process, and a hot phosphoric acid solution may be used as an etch solution during the wet etching process. In other embodiments, the barrier layer and the second protective layer may be made of different materials.

Figure 13:
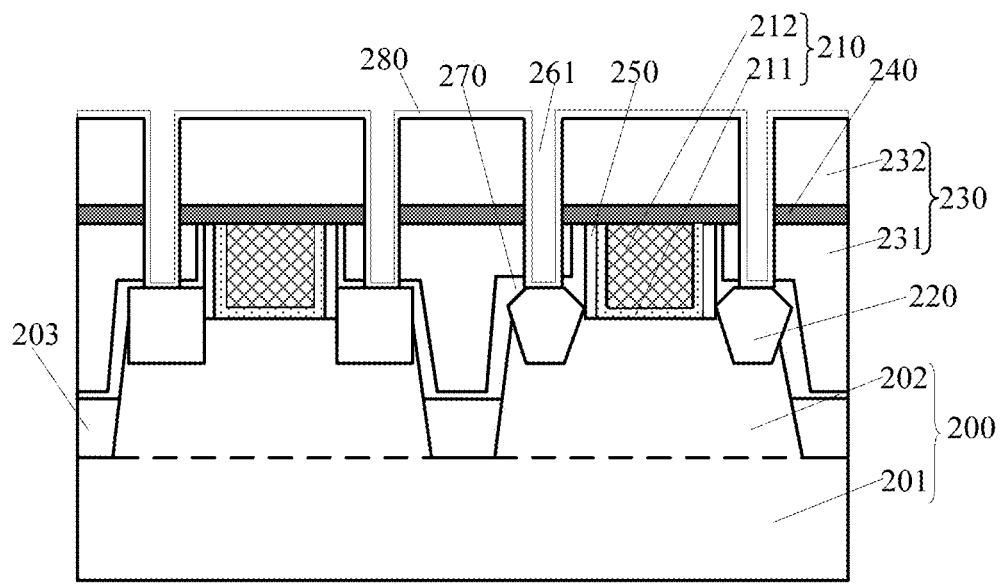

Further, returning to FIG. 16, after removing the barrier layer at the bottom of the plurality of second vias, a metal layer may be formed on the surface of the source/drain doped layer at the bottom of the plurality of first vias (S406). FIGS. 13-14 illustrate schematic cross-sectional views of a semiconductor structure consistent with various embodiments of the present disclosure. Specifically, FIG. 13 illustrates a structural view processed from the structural view shown in FIG. 11, and FIG. 14 illustrates a structural view processed from the structural view shown in FIG. 12.

Referring to FIGS. 13-14, after removing the barrier layer 240 at the bottom of the plurality of second vias 262 (referring to FIG. 12), a metal layer 280 may be formed on the surface of the source/drain doped layer 220 at the bottom of the plurality of first vias 261. In one embodiment, the metal layer 280 may also cover the sidewall surfaces of the plurality of first vias 261, the sidewall and bottom surfaces of the plurality of second vias 262, and the top surface of the dielectric layer 230. The metal layer 280 may be made of a material including Ti, Ni, or Co.

In one embodiment, after performing the pre-amorphizing implantation process, the barrier layer 240 at the bottom of the plurality of second vias 262 as well as the second protective layer 270 at the bottom of the plurality of first vias 261 may be immediately removed. After removing the barrier layer 240 at the bottom of the plurality of second vias 262 and the second protective layer 270 at the bottom of the plurality of first vias 261, the step of forming the meal layer 280 may be performed immediately. As such, after performing the pre-amorphizing implantation process and prior to removing the barrier layer 240 at the bottom of the plurality of second vias 262 and the second protective layer 270 at the bottom of the plurality of first vias 261, the disclosed method may not include any process step that may affect the amorphous state of the surface material of the source/drain doped layer 220. For example, no etching process may be performed between the step of pre-amorphizing implantation and the step of removing the barrier layer 240 at the bottom of the plurality of second vias 262 and the second protective layer 270 at the bottom of the plurality of first vias 261. Moreover, after removing the barrier layer 240 at the bottom of the plurality of second vias 262 and the second protective layer 270 at the bottom of the plurality of first vias 261 and prior to forming the metal layer 280, the disclosed method may not include any process step that may affect the amorphous state of the surface material of the source/drain doped layer 220. For example, no etching process may be performed between the step of removing the barrier layer 240 at the bottom of the plurality of second vias 262 and the second protective layer 270 at the bottom of the plurality of first vias 261 and the step of forming the metal layer 280.

In one embodiment, after forming the metal layer 280, the method for forming the semiconductor device may also include forming a first protective layer (not shown) on the sidewall and bottom surfaces of the plurality of first vias 261, the sidewall and bottom surfaces of the plurality of second vias 262, and the dielectric layer 230. The first protective layer may be located on the surface of the metal layer 280.

The first protective layer may be made of a material including TiN or TaN. In other embodiments, the method for forming the semiconductor device may not include forming the first protective layer.

Further, returning to FIG. 16, after forming the metal layer, an annealing process may be performed to form a metal silicide layer through the reaction between the metal layer and the surface material of the source/drain doped layer (S407). FIG. 15 illustrates a schematic cross-sectional view of a semiconductor structure consistent with various embodiments of the present disclosure. Specifically, FIG. 15 illustrates a structural view processed from the structural view shown in FIG. 13.

Referring to FIG. 15, after forming the metal layer 280, an annealing process may be performed such that the metal layer 280 may react with the surface material of the source/drain doped layer 220 to form a metal silicide layer 281. That is, the metal silicide layer 281 may be formed through the reaction between the metal layer 280 and the surface material of the source/drain doped layer 220 during the annealing process.

Because a pre-amorphizing implantation process is performed prior to performing the metal silicidation process, the process temperature for the metal silicidation process may be reduced, and the annealing time may also be reduced. When the metal layer 280 is made of Ti, the annealing temperature may be in a temperature range of approximately 750° C. to 850° C., e.g. 800° C., and the annealing time may be in a range of approximately 0.25 ms to 0.4 ms.

When the metal layer 280 is made of Ti, the disclosed method may further demonstrate the following advantages. During the annealing process, the surface material of the source/drain doped layer may diffuse toward the metal layer 280, and thus may form the metal silicide layer 281 through reaction. Therefore, the bottom topography of the metal silicide layer 281 may be desired. For example, forming tip ends at the bottom and the sidewall of the metal silicide layer 281 may be prevented. When tip ends are formed at the bottom and the sidewall of the metal silicide layer, these tip ends may cause penetration in the PN junction between the source/drain doped layer and the channel region, leading to a leakage current.

In one embodiment, a first protective layer is formed prior to performing the annealing process, and during the annealing process, the first protective layer may be able to provide protection for the metal layer 280, preventing oxidization of the metal layer 280 during the annealing process.

In one embodiment, in order to avoid undesired performance stability of the first protective layer caused by recrystallization of the material of the first protective layer at the annealing temperature, the annealing temperature may be lower than 900° C.

In other embodiments, the first protective layer may be formed after performing the annealing process.

In one embodiment, the metal silicidation process may be performed after forming the plurality of second vias 262. The reason for choosing the metal silicidation process to be performed after forming the plurality of second vias 262 may be the following. The step for forming the plurality of second vias 262 may include multiple etching processes. When the metal silicidation process is performed prior to forming the plurality of second vias 262, the multiple etching process performed for forming the plurality of second vias 262 may cause damage to the metal silicide layer, and thus degrade the electrical performance of the metal silicide layer.

Further, the method for forming the semiconductor device may also include the following exemplary steps. After forming the metal silicide layer 281, a plug material layer (not shown) may be formed in the plurality of first vias 261 and the plurality of second vias 262. The plug material layer may also be formed on the dielectric layer 230. Further, the plug material layer, the first protective layer, and the metal layer 280 may be planarized until the top surface of the dielectric layer 230 is exposed. As such, a plurality of first plugs may be formed in the plurality of first vias 261, and a plurality of second plugs may be formed in the plurality of second vias 262. In one embodiment, because the plurality of first plugs and the plurality of second plugs are formed in a single fabrication process, the fabrication process may be simplified.

After forming the plurality of first plugs, the first protective layer may be located between the plurality of first plugs and the metal silicide layer 281, and also between the plurality of first plugs and the dielectric layer 230. The portion of the first protective layer located in the plurality of first vias may be used to prevent diffusion of the atoms in the plurality of first plugs. After forming the plurality of second plugs, the first protective layer may be located between the plurality of second plugs and the plurality of gate structures, and also between the plurality of second vias and the dielectric layer 230. The portion of the first protection layer in the plurality of second vias may also be used to prevent diffusion of the atoms in the plurality of second plugs.

Further, the present disclosure also provides a semiconductor device formed by using the method described above. FIG. 15 illustrates a schematic cross-sectional view of a semiconductor device consistent with various embodiments of the present disclosure.

Referring to FIG. 15, the semiconductor device may include a base substrate 200. In one embodiment, the semiconductor device may be a device including a plurality of Fin-FETs, and accordingly, the base substrate 200 may include a semiconductor substrate 201 and a plurality of fin structures 202 formed on the semiconductor substrate 201.

In other embodiments, the semiconductor device may be a device including a plurality of planar MOS transistors, and accordingly, the base substrate may be a planar semiconductor substrate.

In one embodiment, the semiconductor substrate 201 may be made of single-crystalline silicon. In other embodiments, the semiconductor substrate may be made of amorphous silicon or poly-crystalline silicon. Alternatively, the semiconductor substrate may be made of germanium, silicon germanium, gallium arsenide, or any other appropriate semiconductor materials or structures.

In one embodiment, the semiconductor device may include an isolation structure 203 formed on the semiconductor substrate 201. The isolation structure 203 may cover a portion of the sidewall surfaces of the plurality of fin structures 202, and the top surface of the isolation structure 203 may be lower than the top surfaces of the plurality of fin structures 202. The isolation structure 203 may be made of silicon oxide.

Referring to FIG. 15, the semiconductor device may further include a plurality of gate structures 210 formed on the base substrate 200, a source/drain doped layer 220 formed in the base substrate 200 on both sides of each gate structure 210, and a dielectric layer 230 covering the base substrate 200, the source/drain doped layer 220, and the plurality of gate structures 210. Moreover, the semiconductor device may also include a barrier layer 240 formed on the top surface of each gate structure. The barrier layer 240 may be covered by the dielectric layer 230.

In one embodiment, the dielectric layer 230 may be made of a material including silicon oxide. In addition, the dielectric layer 230 may include a first interlayer dielectric layer 231 and a second interlayer dielectric layer 232 separated by the barrier layer 240.

In one embodiment, each gate structure 210 may include a gate dielectric layer 211 and a gate electrode layer 212 formed on the gate dielectric layer 211. The gate dielectric layer 211 may be made of a high-k dielectric material. The gate electrode layer 212 may be made of a metal. In one embodiment, the plurality of gate structures 210 may be formed across the plurality of fin structures 210 and may cover a portion of the top and sidewall surfaces of each fin structure 210.

Further, the semiconductor dive may include a plurality of first vias 261 formed above the source/drain doped layer 220 through the dielectric layer 230 and the barrier layer 240; and a metal silicide layer 281 formed at the bottom of the plurality of first vias 261. That is, the metal silicide layer 281 may be located on the top surface of the source/drain doped layer 220 that is exposed by the plurality of first vias 261.

Further, the semiconductor device may also include a plurality of second vias 262 (referring to FIG. 14) formed above the top surfaces of the plurality of gate structures 210 through the second dielectric layer 232 and the barrier layer 240.

Compared to conventional semiconductor devices and fabrication methods, the disclosed semiconductor devices and fabrication methods may demonstrate the following advantages.

According to the disclosed semiconductor structures and fabrication methods, the surface material of the source/drain doped layer is amorphized through a pre-amorphizing implantation process, which is conducive to reducing the annealing temperature and the annealing time of the subsequently-performed metal silicidation process. The pre-amorphizing implantation process is performed after forming the plurality of second vias, such that the number of steps between the pre-amorphizing implantation process and the metal silicide process is limited. Therefore, the influence on the amorphous state of the surface material of the source/drain doped layer may be reduced. During the pre-amorphizing implantation process, a barrier layer formed on the top surfaces of the plurality of gate structures prevents implantation of the doping into the plurality of gate structures, thereby avoiding unpredictable fluctuations in the electrical performance of the semiconductor device, e.g. fluctuations in the threshold voltage. In addition, during the pre-amorphizing implantation process, the metal atoms may not be sputtered on the top surfaces of the plurality of gate structures, and thus contamination of the chamber used for pre-amorphizing implantation may be prevented.

Further, the pre-amorphizing implantation process uses Ge ions as the doping ions. Ge ions are neither N-type ions, nor P-type ions, and thus Ge ions may have negligible effect on the electrical performance of the source/drain doped layer.

Further, during the pre-amorphizing implantation process, the doping ions are implanted into the surface of the source/drain doped layer through the second protective layer to amorphize the surface material of the source/drain doped layer. The doping ions may penetrate through the second protective layer and may be scattered into the source/drain doped layer, such that the doping ions may not be implanted deeply into the source/drain doped layer by penetrating through the lattice gap of the source/drain doped layer, which may facilitate the amorphization of the surface material of the source/drain doped layer.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a base substrate;
   forming a plurality of gate structures, a source/drain doped layer, a barrier layer, and a dielectric layer, wherein the plurality of gate structures is formed on the base substrate, the source/drain doped layer is formed in the base substrate on both sides of each gate structure, the barrier layer covers entire top surfaces of the plurality of gate structures, and the dielectric layer covers the base substrate, the source/drain doped layer, the barrier layer, and the plurality of gate structures;
   forming a plurality of first vias in the dielectric layer on both sides of each of the plurality of gate structures and above the source/drain doped layer;
   after forming the plurality of first vias, forming a second via on each of the plurality of gate structures through the dielectric layer to expose the barrier layer;
   after forming the second via and the barrier layer, performing a pre-amorphizing implantation process on a surface of the source/drain doped layer at a bottom of the plurality of first vias;
   after performing the pre-amorphizing implantation process, removing the barrier layer at a bottom of each second via; and
   after removing the barrier layer at the bottom of the each second via, forming a metal silicide layer on the surface of the source/drain doped layer through a metal silicidation process.

2. The method according to claim 1, wherein:
   the barrier layer and the dielectric layer are made of different materials; and
   the barrier layer is made of a material including $SiN_x$, SiOCN, SiBCN, or SiCN.

3. The method according to claim 1, wherein:
   a thickness of the barrier layer is in a range of approximately 3 nm to 5 nm.

4. The method according to claim 1, wherein:
   ions implanted during the pre-amorphizing implantation process include germanium ions.

5. The method according to claim 1, wherein:
   each of the plurality of gate structures includes a gate dielectric layer and a gate electrode layer formed on the gate dielectric layer, wherein:
   the gate dielectric layer is made of a high-k material with a relative dielectric constant greater than 3.9, and
   the gate electrode layer is made of a metal.

6. A semiconductor device formed by the method according to claim 1.

7. The method according to claim 1, further including:
   when forming the plurality of gate structures, the source/drain doped layer, the barrier layer, and the dielectric layer, forming a second protective layer on the surface of the source/drain doped layer, wherein:
   the dielectric layer covers the second protective layer;
   after forming the plurality of first vias, and prior to performing the metal silicidation process, the second protective layer is exposed at a bottom of the plurality of first vias;
   the pre-amorphizing implantation process is performed with the second protective layer as protection; and
   when removing the barrier layer at the bottom of the each second via, the second protective layer at the bottom of the plurality of first vias is also removed.

8. The method according to claim 7, wherein:
   the second protective layer is made of $SiN_x$, SiOCN, SiBCN, or SiCN; and
   a thickness of the second protective layer is in a range of approximately 3 nm to 5 nm.

9. The method according to claim 1, wherein the semiconductor device is a device including a plurality of fin field-effect transistors (Fin-FETs), and:
   the base substrate includes a semiconductor substrate and a plurality of fin structures formed on the semiconductor substrate;

the plurality of gate structures are formed across the plurality of fin structures and covers a portion of top and sidewall surfaces of each of the plurality of fin structures; and the source/drain doped layer is formed in the plurality of fin structures on both sides of each of the plurality of gate structures.

10. The method according to claim 9, prior to forming the plurality of gate structures, the source/drain doped layer, the barrier layer, and the dielectric layer, further including:

forming an isolation structure, wherein:
the isolation structure covers a portion of the sidewall surfaces of the plurality of fin structures; and
a top surface of the isolation structure is lower than the top surfaces of the plurality of fin structures.

11. The method according to claim 1, wherein:
the dielectric layer includes a first interlayer dielectric layer and a second interlayer dielectric layer.

12. The method according to claim 11, wherein:
the top surfaces of the plurality of gate structures are leveled with a top surface of the first interlayer dielectric layer;
the barrier layer is located on the top surface of the first interlayer dielectric layer and also on the top surfaces of the plurality of gate structures; and
the plurality of first vias also penetrates through the barrier layer on the source/drain doped layer.

13. The method according to claim 11, wherein:
the top surfaces of the plurality of gate structures are lower than a top surface of the first interlayer dielectric layer; and
after forming the plurality of gate structures, the barrier layer is formed to only cover the top surfaces of the plurality of gate structures.

14. The method according to claim 13, wherein forming the barrier layer includes:
forming a barrier material layer on the first interlayer dielectric layer; and
forming the barrier layer by planarizing the barrier material layer until the top surface of the first interlayer dielectric layer is exposed.

15. The method according to claim 1, wherein the metal silicidation process includes:
forming a metal layer on the surface of the source/drain doped layer at the bottom of the plurality of first vias;
after forming the metal layer, performing an annealing process such that the metal layer reacts with a surface material of the source/drain doped layer to form the metal silicide layer.

16. The method according to claim 15, wherein:
the metal layer is made of Ti, Ni, or Co.

17. The method according to claim 16, wherein:
the metal layer is made of Ti;
an annealing temperature of the annealing process is in a range of approximately 750° C. to 850° C.; and
an annealing time of the annealing process is in a range of approximately 0.25 ms to 0.4 ms.

18. The method according to claim 15, wherein:
the metal layer is also formed on sidewall surfaces of the plurality of first vias, and also on sidewall and bottom surfaces of the each second via; and
the method for fabricating the semiconductor device further includes:
after forming the metal layer and prior to performing the annealing process, forming a first protective layer on the sidewall and bottom surfaces of the plurality of first vias and the sidewall and bottom surfaces of the each second via.

19. The method according to claim 18, wherein:
the first protective layer is made of a material including TiN or TaN.

20. The method according to claim 18, after forming the metal silicide layer, further including:
forming a plug material layer in the plurality of first vias and the each second via, and also on the dielectric layer; and
forming a plurality of first plugs in the plurality of first vias and a second plug in the each second via by planarizing the plug material layer, the first protective layer, and the metal layer until a top surface of the dielectric layer is exposed.

* * * * *